United States Patent [19]
Okada

[11] Patent Number: 5,884,153
[45] Date of Patent: Mar. 16, 1999

[54] DELAYED AUTOMATIC GAIN CONTROL CIRCUIT

[75] Inventor: Minobu Okada, Fukushima-ken, Japan

[73] Assignee: Alps Electric Co., Ltd., Tokyo, Japan

[21] Appl. No.: 762,082

[*] Notice: This patent issued on a continued prosecution application filed under 37 CFR 1.53(d), and is subject to the twenty year patent term provisions of 35 U.S.C. 154(a)(2).

[22] Filed: Dec. 9, 1996

[30] Foreign Application Priority Data

Dec. 20, 1995 [JP] Japan ................................ 7-335127

[51] Int. Cl.$^6$ ........................................................ H04B 1/06
[52] U.S. Cl. ................................ 455/243.1; 455/242.1; 455/251.1; 455/200.1; 330/129; 330/279; 348/731; 348/685
[58] Field of Search ................................ 455/232.1, 234.1, 455/234.2, 239.1, 240.1, 241.1, 242.1, 242.2, 243.1, 244.1, 245.1, 245.2, 249.1, 250.1, 251.1, 253.1, 219, 200.1, 126; 330/133, 134, 129, 279; 348/726, 731, 732, 733, 678, 679, 685; H04N 5/52, 5/53

[56] References Cited

U.S. PATENT DOCUMENTS

| | | | |
|---|---|---|---|
| 3,450,834 | 6/1969 | Marinis et al. | 348/678 |
| 4,186,351 | 1/1980 | Brefini et al. | 455/234.1 |
| 4,630,117 | 12/1986 | Parker | 348/678 |
| 5,263,186 | 11/1993 | Gornati et al. | 455/241.1 |

FOREIGN PATENT DOCUMENTS

| | | | |
|---|---|---|---|
| 491423-A1 | 6/1992 | European Pat. Off. | H04N 5/52 |
| 63-294005 | 11/1988 | Japan. | |

*Primary Examiner*—Doris H. To
*Attorney, Agent, or Firm*—Brinks Hofer Gilson & Lione

[57] ABSTRACT

A delayed automatic gain control circuit using a simple delayed AGC voltage generation section and capable of fixing a start point of AGC in an RF amplification section at a predetermined received signal level without performing a special adjusting operation even if there are variations in the characteristics of circuit sections. The delayed automatic gain control circuit has a tuner including the RF amplification section, an AGC voltage generation section for generating an AGC voltage dependent on an output signal from the tuner, and an AGC voltage setting section for converting the AGC voltage into a delayed AGC voltage which is supplied to the RF amplification section of the tuner. The AGC voltage setting section is formed by a resistor voltage divider for dividing a power supply voltage and a diode connected to one voltage dividing point of the resistor voltage divider to selectively supply the AGC control voltage to the voltage dividing point according to the level of the AGC voltage. The delayed AGC voltage is output from another voltage dividing point of the resistor voltage divider.

2 Claims, 6 Drawing Sheets

55 DELAYED AGC VOLTAGE GENERATION SECTION

DELAYED AUTOMATIC GAIN CONTROL CIRCUIT

BACKGROUND OF THE INVENTION

1. Field of the Invention

The present invention relates generally to delayed automatic gain control circuits and, more particularly, to a delayed automatic gain control circuit in which a start point of delayed automatic gain control in a radio frequency amplification section of a tuner is set so as to be generally constant without being influenced by variations in the gain of the tuner, in the gain of an intermediate frequency amplification section and in a gain control characteristic of the intermediate frequency amplification section.

2. Description of the Related Art

In receivers having a tuner, automatic gain control (hereinafter referred to as AGC) is ordinarily performed by supplying an AGC voltage to a radio frequency amplification section and to an intermediate frequency amplification section to limit the change in the level of a detection output due to a large variation in the level of a received signal to a comparatively small value. There is a need to separately set AGC start points in the radio frequency amplification section and the intermediate frequency amplification section where AGC is executed in order to optimize the conditions of signal distortions and noise figures (NF). Accordingly, the receiver is arranged so as to independently set an AGC voltage-gain characteristic of the radio frequency amplification section and an AGC voltage-gain characteristic of the intermediate frequency amplification section. For example, as a circuit suitable for such characteristic setting, a delayed AGC circuit has been used which performs reverse AGC in the intermediate frequency amplification section such as to change the gain in immediate response to a change in an AGC voltage but which performs delayed reverse AGC in the radio frequency amplification section such as to change the gain only when an AGC voltage becomes higher than a predetermined level.

FIG. 4 is a block diagram showing the configuration of an example of such a known delayed AGC circuit, and FIG. 5 is a characteristic diagram showing the relationship between the level of a received signal and AGC voltages in the known delayed AGC circuit shown in FIG. 4.

As shown in FIG. 4, this known delayed AGC circuit is formed by a radio frequency (RF) amplification section 41, a mixing section 42, a local oscillator 43, an intermediate frequency (IF) amplification section 44, a video detection section 45, an AGC voltage generation section 46 and a delayed AGC voltage generation section 47. The RF amplification section 41, the mixing section 42 and the local oscillator 43 form a tuner 40.

The RF amplification section 41 has an input point connected to a receiving antenna 48 through a tuner input terminal 49 and has an output point connected to one of two input points of the mixing section 42. The mixing section 42 has the other input point connected to the local oscillator 43 and has an output point connected to an input point of the IF amplification section 44 through a tuner output terminal 50. The video detection section 45 has an input point connected to an output point of the IF amplification section 44 and has an output point connected to an input point of the AGC voltage generation section 46. The AGC voltage generation section 46 has an output point connected to a control point of the IF amplification section 44 and has another output point connected to an input point of the delayed AGC voltage generation section 47. The delayed AGC voltage generation section 47 has an output point connected to a control point of the RF amplification section 41.

The delayed AGC circuit having the above-described configuration operates as described below.

A signal received by the receiving antenna 48 is supplied to the RF amplification section 41 through the tuner input terminal 49 to be amplified in the RF amplification section 41. The amplified received signal is frequency-mixed in the mixing section 42 with an oscillated signal from the local oscillator 43 to form a frequency-mixed signal which is supplied to the IF amplification section 44 through the tuner output terminal 50. Only a signal in the frequency-mixed signal having a frequency coinciding with the intermediate frequency of the IF amplification section 44 is selectively amplified in the IF amplification section 44 and is thereafter supplied to the video detection section 45. The video detection section 45 performs video detection of the input IF signal and supplies a video detection output to the AGC voltage generation section 46. At this time, the AGC voltage generation section 46 generates a first AGC voltage $V_{AGC}$ indicated on a curve i in FIG. 5 and a second AGC voltage $V_{IAGC}$ indicated on a curve ii in FIG. 5. Second AGC voltage $V_{IAGC}$ is supplied to the IF amplification section 44. The gain of the IF amplification section 44 is controlled according to second AGC voltage $V_{IAGC}$. First AGC voltage $V_{AGC}$ is supplied to the delayed AGC voltage generation section 47. In response to the input first AGC voltage $V_{AGC}$, the delayed AGC voltage generation section 47 generates a delayed AGC voltage $V_{DAGC}$ indicated on a curve iii in FIG. 5. Delayed AGC voltage $V_{DAGC}$ is supplied to the RF amplification section 41. The gain of the RF amplification section 41 is controlled according to delayed AGC voltage $V_{DAGC}$.

As shown in FIG. 5, when the received signal level is low, that is, in the first range below level $L_1$, the level of the video detection output from the video detection section 45 is comparatively low and voltage output characteristics of the AGC voltage generation section 46 are such that, as the received signal level increases, first AGC voltage $V_{AGC}$ (curve i) decreases from its maximum value and second AGC voltage $V_{IAGC}$ (curve ii) also decreases from its maximum value. Although the delayed AGC voltage generation section 47 is supplied with first AGC voltage $V_{AGC}$ decreasing while the received signal level is increasing, it outputs a maximum constant voltage as delayed AGC voltage $V_{DAGC}$ (curve iii) since first AGC voltage $V_{AGC}$ is in a comparatively high range. Consequently, when the received signal level is in the first range, AGC according to the received signal level is executed in the IF amplification section 44 but AGC is not executed in the RF amplification section 41 and the maximum gain of the RF amplification section 41 is maintained.

Next, when the received signal level increases in the second range between level $L_1$ and level $L_2$, the video detection output increases with the received signal level and AGC voltage characteristics are such that, as the received signal level increases, first AGC voltage $V_{AGC}$ (curve i) decreases continuously from its state corresponding to the first range of the received signal level but second AGC voltage $V_{IAGC}$ (curve ii) is maintained generally constantly at the minimum level. With first AGC voltage $V_{AGC}$ decreasing into a comparatively low range, the delayed AGC voltage generation section 47 outputs delayed AGC voltage $V_{DAGC}$ (curve iii) decreasing with first AGC voltage $V_{AGC}$, which is decreasing while the received signal level is increasing. Consequently, when the received signal level is in the second range, delayed AGC according to the received signal level is executed in the RF amplification section 41 but AGC in the IF amplification section 44 becomes irresponsive to the change in the received signal level to maintain the minimum gain of the IF amplification section 44.

When the received signal level increases further in the third range above level $L_2$, the video detection output also increases with the received signal level and AGC voltage characteristics are such that, as the received signal level increases, first AGC voltage $V_{AGC}$ (curve i) decreases continuously from its state corresponding to the second range of the received signal level while second AGC voltage $V_{IAGC}$ (curve ii) is maintained generally constantly at the minimum level. With first AGC voltage $V_{AGC}$ decreasing into the lowest range, the delayed AGC voltage generation section 47 outputs delayed AGC voltage $V_{DAGC}$ (curve iii) which is maintained generally constantly at a minimum level while the received signal level is increasing. Consequently, when the received signal level is in the third range, delayed AGC in the RF amplification section 41 becomes irresponsive to the change in the received signal level to maintain the minimum gain of the RF amplification section 41. Also, AGC in the IF amplification section 44 is irresponsive to the change in the received signal level and the minimum gain of the IF amplification section 44 is maintained.

As described above, the above-described known delayed AGC circuit selectively performs delayed AGC in the RF amplification section 41 according to the received signal level and selectively performs AGC in the IF amplification section 44 according to the received signal level, thereby obtaining a detection output which is not directly dependent on the received signal level.

Ordinarily, the above-described known delayed AGC circuit varies in the gain of the tuner 40, the gain of the IF amplification section 44, the AGC characteristic of the IF amplification section 44 (the gain attenuation curve corresponding to the change in AGC voltage $V_{AGC}$) and so on. Correspondingly, first AGC voltage $V_{AGC}$ output from the AGC voltage generation section 46, second AGC voltage $V_{IAGC}$ output from the AGC voltage generation section 46 and/or delayed AGC voltage $V_{DAGC}$ output from the delayed AGC voltage generation section 47 varies. If delayed AGC voltage $V_{DAGC}$ varies, the received signal level at which delayed AGC is started in the RF amplification section 41 varies, resulting in failure to obtain the desired AGC characteristic.

A delayed AGC circuit designed to eliminate such a drawback as disclosed in Japanese Utility Model Laid-Open Publication No. 140773/1988, for example, has been developed. This delayed AGC circuit has a variable resistor for compensation for a variation in first AGC voltage $V_{AGC}$ externally added to the delayed AGC voltage generation section. Delayed AGC voltage $V_{DAGC}$ is adjusted by using this variable resistor to such a value as to constantly maintain the received signal level at which AGC is started in the RF amplification section.

FIG. 6 is a diagram schematically showing the configuration of a delayed AGC circuit disclosed in Japanese Utility Model Laid-Open Publication No. 140773/1988.

As shown in FIG. 6, this delayed AGC circuit is formed by a tuner 51 including an RF amplification stage (not shown), an IF amplification section 52, a video detection section 53, an AGC voltage generation section 54 and a delayed AGC voltage generation section 55. These component sections correspond to the tuner 40, the IF amplification section 44, the video detection section 45, the AGC voltage generation section 46 and the delayed AGC voltage generation section 47 of the known receiver shown in FIG. 4. The delayed AGC voltage generation section 55 has a differential amplification stage formed by transistors 56 and 57, an input stage formed by an emitter-follower transistor 58, an output stage formed by a common-emitter transistor 59, a collector resistor 60 and so on. A variable resistor 61 for adjusting the delayed AGC voltage, a resistor voltage divider 62 and other parts are externally added to the delayed AGC voltage generation section 55.

The operation of the delayed AGC circuit disclosed in Japanese Utility Model Laid-Open Publication No. 140773/1988 is substantially the same as that of the known AGC circuit shown in FIG. 4 except for the internal operation of the delayed AGC voltage generation section 55. Therefore, only the operation of the delayed AGC voltage generation section 55 will be described below.

In the delayed AGC voltage generation section 55, AGC voltage $V_{AGC}$ output from the AGC voltage generation section 54 is applied to the base of the transistor 56 forming the differential amplification stage through the emitter-follower transistor 58, and bias voltage $V_B$ obtained in accordance with the setting of the delayed AGC voltage adjusting variable resistor 61 is applied to the base of the other transistor 57 forming the differential amplification stage. Bias voltage $V_B$ is set so that $V_B = V_{AGC} - V_{be56}$ ($V_{be56}$: the base-emitter voltage of the transistor 56).

When the received signal level is comparatively low (at the time of weak field input), AGC voltage $V_{AGC}$ has such a large value that the transistor 56 is on, the transistor 57 is off and the output-stage transistor 59 is on, so that a maximum terminal voltage is generated across the collector resistor 60 by the current passing through the collector resistor 60. At this time, the maximum terminal voltage is supplied to the RF amplification stage of the tuner 51 through the resistor voltage divider 62, thereby maximizing the gain of the RF amplification stage.

When the received signal level becomes higher (at the time of medium field input), AGC voltage $V_{AGC}$ becomes lower, and the transistor 56 is changed from the completely-on state to an intermediate on state. Simultaneously, the output-stage transistor 59 is changed from the completely-on state to an intermediate on state to reduce the current passing through the collector resistor 60, so that the terminal voltage across the collector resistor 60 decreases. The decreasing terminal voltage is supplied to the RF amplification stage of the tuner 51 through the resistor voltage divider 62. The gain of the RF amplification stage is thereby reduced from the maximum value toward the minimum value.

When the received signal level becomes much higher (at the time of strong field input), AGC voltage $V_{AGC}$ has such a value that the transistor 56 is off, the transistor 57 is on and the output-stage transistor 59 is off, so that the current passing through the collector resistor 60 is zero. A minimum terminal voltage (zero voltage) is thereby generated across the collector resistor 60. At this time, the minimum terminal voltage is supplied to the RF amplification stage of the tuner 51 through the resistor voltage divider 62, thereby minimizing the gain of the RF amplification stage.

Thus, in the above-described delayed AGC circuit disclosed in Japanese Utility Model Laid-Open Publication No. 140773/1988, if the delayed AGC voltage adjusting variable resistor 61 is adjusted to set the bias voltage $V_B$ to a predetermined value, the received signal level at which AGC is started in the RF amplification stage of the tuner 51 can be constantly maintained with respect to each of variations in the gain of the tuner, the gain of the IF amplification stage 52 and the AGC characteristic of the IF amplification stage 52.

Although the above-described delayed AGC circuit disclosed in Japanese Utility Model Laid-Open Publication No. 140773/1988 can be adjusted so that the received signal level at which AGC is started in the RF amplification stage of the tuner 51 is constant with respect to each of variations in the gain of the tuner, the gain of the IF amplification stage 52 and the AGC characteristic of the IF amplification stage 52, it is necessary to operate the delayed AGC voltage adjusting variable resistor 61 for such individual adjustment. Also, the delayed AGC voltage generation section 55 having the delayed AGC voltage adjusting variable resistor 61 externally attached has a complicated circuit configuration.

SUMMARY OF THE INVENTION

In view of the above-described problems of the conventional art, an object of the present invention is to provide a delayed AGC circuit using a simple delayed automatic gain voltage generation section and capable of fixing a start point of AGC in a radio frequency amplification section at a predetermined received signal level without performing a special adjusting operation even if there are variations in the characteristic of circuit sections.

To achieve this object, according to the present invention, there is provided a delayed automatic gain control circuit comprising a tuner including a radio frequency amplification section, an automatic gain control voltage generation section for generating an automatic gain control voltage dependent on an output signal from the tuner, and an automatic gain control voltage setting section for converting the automatic gain control voltage into a delayed automatic gain control voltage which is supplied to the radio frequency amplification section of the tuner. The automatic gain control voltage setting section is formed by a resistor voltage divider for dividing a power supply voltage and a diode connected to one voltage dividing point of the resistor voltage divider to selectively supply the automatic gain control voltage to the voltage dividing point according to the level of the automatic gain control voltage. The delayed automatic gain control voltage is output from another voltage dividing point of the resistor voltage divider.

In the above-described delayed automatic gain control circuit, the automatic gain control (AGC) voltage setting section (corresponding to the delayed AGC voltage generation section) has a resistor voltage divider for dividing a power supply voltage and a diode connected to one voltage dividing point of the resistor voltage divider to selectively supply the AGC voltage to the voltage dividing point. When the AGC voltage is set to a high level in response to a low received signal level, the diode is off and the AGC voltage is not applied to the resistor voltage divider. In this case, the delayed AGC voltage output from the resistor voltage divider is a comparatively high constant voltage. The maximum gain of the radio frequency amplification section is maintained by the application of this constant voltage. When the AGC voltage is increased in response to an increase in received signal level, the diode is turned on to apply the AGC voltage to the resistor voltage divider. The delayed AGC is thereby output from the resistor voltage divider as a comparatively low variable voltage dependent upon the AGC voltage. By the application of this variable voltage, the gain of the radio frequency amplification section is reduced from the maximum value. The points at which the diode is turned on and off are determined by selecting the resistance values of the resistors forming the resistor voltage divider and the resistance value of a resistor for applying a dc bias to the diode.

In the above-described delayed automatic gain control circuit, a simpler circuit may suffice as the AGC voltage setting section (delayed AGC voltage generation section) and the point at which the delayed AGC voltage starts changing can be controlled and set as desired without performing a special adjusting operation.

DESCRIPTION OF THE PREFERRED EMBODIMENT

A preferred embodiment of the present invention will be described in detail with reference to the accompanying drawings.

Figure 1:
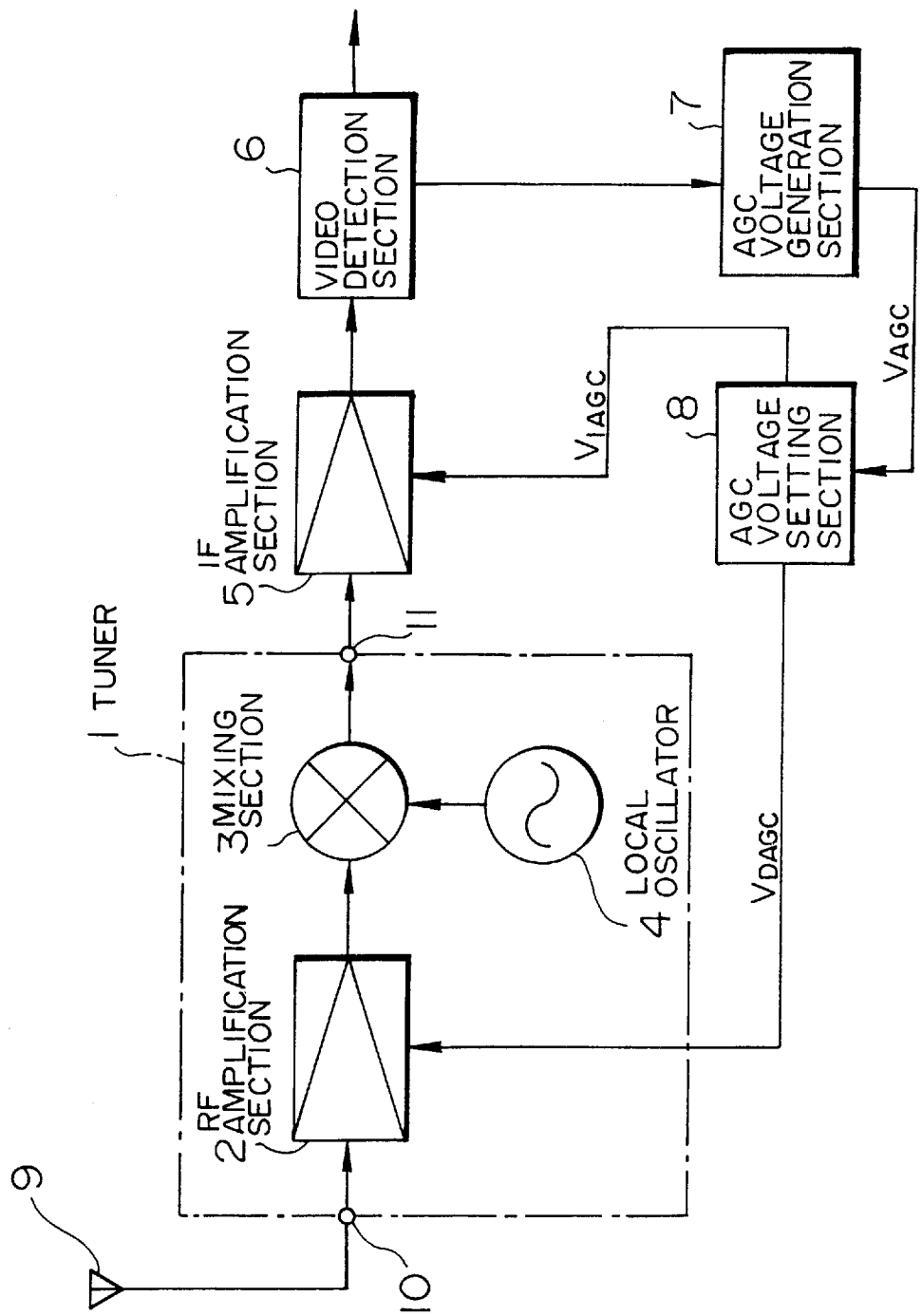
FIG. 1 is a circuit diagram of a delayed AGC circuit which represents an embodiment of the present invention.

FIG. 1 shows the configuration of a delayed automatic gain control (AGC) circuit which represents an embodiment of the present invention.

As shown in FIG. 1, the delayed AGC circuit is formed by a radio frequency (RF) amplification section 2, a mixing section 3, a local oscillator 4, an intermediate frequency (IF) amplification section 5, a video detection section 6, an automatic gain control (AGC) voltage generation section 7, and an automatic gain control (AGC) voltage setting section 8. The RF amplification section 2, the mixing section 3 and the local oscillator 4 form a tuner 1. The IF amplification section 5 forms an intermediate frequency circuit.

The RF amplification section 2 has an input point connected to a receiving antenna 9 through a tuner input terminal 10 and has an output point connected to one of two input points of the mixing section 3. The mixing section 3 has the other input point connected to the local oscillator 4 and has an output point connected to an input point of the IF amplification section 5 through a tuner output terminal 11. The video detection section 6 has an input point connected to an output point of the IF amplification section 5 and has an output point connected to an input point of the AGC voltage generation section 7. The AGC voltage setting section 8 has an input point connected to an output point of the AGC voltage generation section 7, one of its two output points connected to a control point of the IF amplification section 5, and the other output point connected to a control point of the RF amplification section 2.

The delayed AGC circuit of the present invention having the above-described configuration operates as described below.

A signal received by the receiving antenna 9 is supplied to the RF amplification section 2 through the tuner input terminal 10 to be amplified in the RF amplification section 2. The amplified received signal is frequency-mixed in the mixing section 3 with an oscillated signal from the local oscillator 4 to form a frequency-mixed signal which is supplied to the IF amplification section 5 through the tuner output terminal 11. Only IF signal coinciding with the intermediate frequency in the frequency-mixed signal is selectively amplified in the IF amplification section 5 and is thereafter supplied to the video detection section 6. The video detection section 6 performs video detection of the input IF signal and supplies a video detection output to the AGC voltage generation section 7. The AGC voltage generation section 7 generates an AGC voltage $V_{AGC}$ according to the video detection output from the video detection section 6, and supplies AGC voltage $V_{AGC}$ to the AGC voltage setting section 8. In response to the input AGC voltage $V_{AGC}$, the AGC voltage setting section 8 generates an AGC voltage $V_{IAGC}$ which changes generally in accordance with AGC voltage $V_{AGC}$, and supplies the generated AGC voltage $V_{IAGC}$ to the IF amplification section 5 to control the gain of IF amplification section 5. The AGC voltage setting section 8 also generates an AGC voltage $V_{DAGC}$ which changes only when the input AGC voltage $V_{AGC}$ is within a predetermined range, and supplies the generated AGC voltage $V_{DAGC}$ to the RF amplification section 2 to control the gain of the RF amplification section 2.

Figure 2:
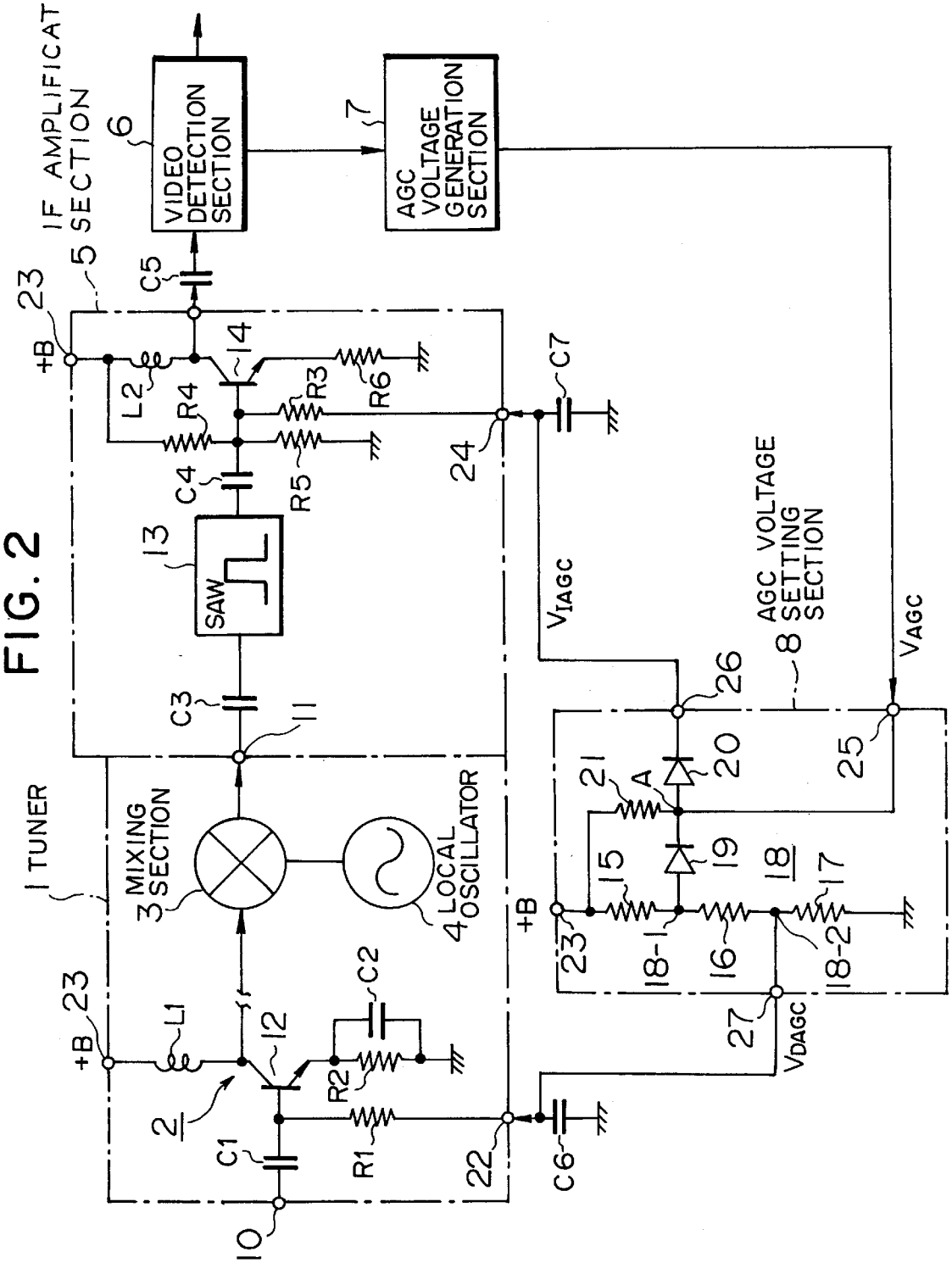
FIG. 2 is a circuit diagram showing examples of the configurations the radio frequency amplification section, the intermediate frequency amplification section and the AGC voltage setting section in the delayed AGC circuit shown in FIG. 1.

FIG. 2 is a circuit diagram showing the configurations of the RF amplification section 2, the IF amplification section 5 and the AGC voltage setting section 8 in the delayed AGC circuit shown in FIG. 1. The same components as those shown in FIG. 1 are indicated by the same reference characters.

As shown in FIG. 2, the RF amplification section 2 includes a first transistor 12 which operates in the common-emitter form, and the IF amplification section 5 includes a surface acoustic wave (SAW) filter 13 and a second transistor 14 which operates in the common-emitter form. The AGC voltage setting section 8 has a resistor voltage divider 18 formed of first to third resistors 15, 16, and 17 connected in series, a first diode 19, a second diode 20, and a bias resistor 21.

In the RF amplification section 2, the transistor 12 has its base connected to the tuner input terminal 10 through a series capacitor C1 and to a delayed AGC voltage supply terminal 22 through a buffer resistor R1, has its emitter grounded through a parallel circuit of an emitter resistor R2 and a bypass capacitor C2, and has its collector connected to a power supply terminal 23 through a load inductor L1 and to the input point of the subsequent mixing section 3.

In the IF amplification section 5, the SAW filter 13 has an input point connected to the tuner output terminal 11 through a series capacitor C3 and has an output point connected to the base of the transistor 14 through a series capacitor C4. The transistor 14 has its base connected to an AGC voltage supply terminal 24 through a buffer resistor R3 and to a point of connection of two power supply voltage dividing resistors R4 and R5, has its emitter grounded through an emitter resistor R6, and has its collector connected to a power supply terminal 23 through a load inductor L2 and to the input point of the subsequent video detection section 6 through a coupling capacitor C5.

In the AGC voltage setting section 8, the resistor voltage divider 18 is connected between a power supply terminal 23 and ground, and the first diode 19 is connected between a coupling point A and a first voltage dividing point 18-1 of the resistor voltage divider 18. The second diode 20 is connected between the coupling point A and an AGC voltage output terminal 26, and the bias resistor 21 is connected between the power supply terminal 23 and the coupling point A. A second voltage dividing point 18-2 of the resistor voltage divider 18 is connected to a delayed AGC voltage output terminal 27. The coupling point A is connected to an AGC voltage input terminal 25.

Further, the delayed AGC voltage supply terminal 22 of the tuner 1 is connected to the delayed AGC voltage output terminal 27 of the AGC voltage setting section 8 and is connected to a grounding point through a bypass capacitor C6. The AGC voltage supply terminal 24 of the IF amplification section 5 is connected to the AGC voltage output terminal 26 of the AGC voltage setting section 8 and is grounded through a bypass capacitor C7. The AGC voltage input terminal 25 of the AGC voltage setting section 8 is connected to the output point of the AGC voltage generation section 7.

Figure 3:
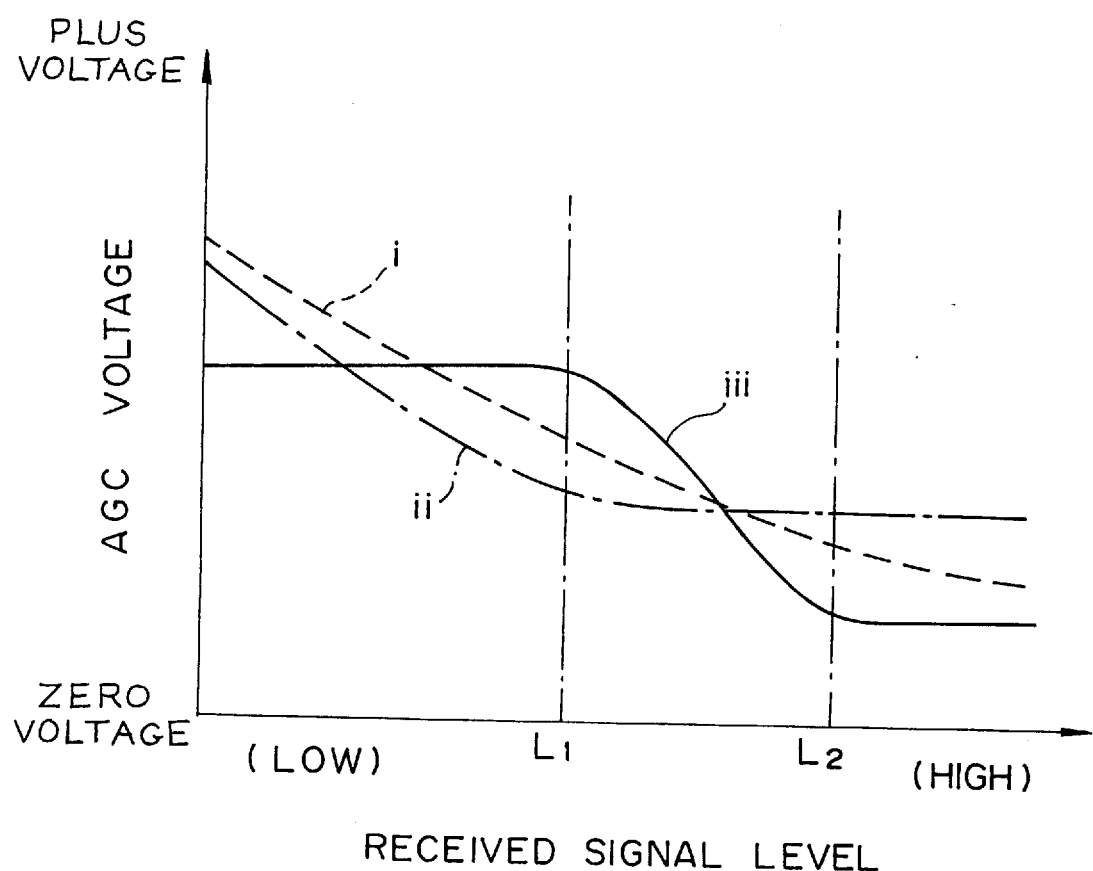
FIG. 3 is a diagram showing examples of the relationship between the received signal level and the AGC voltage and the relationship between the received signal level and the video detection output in the delayed AGC circuit shown in FIG. 2.
Figure 4:
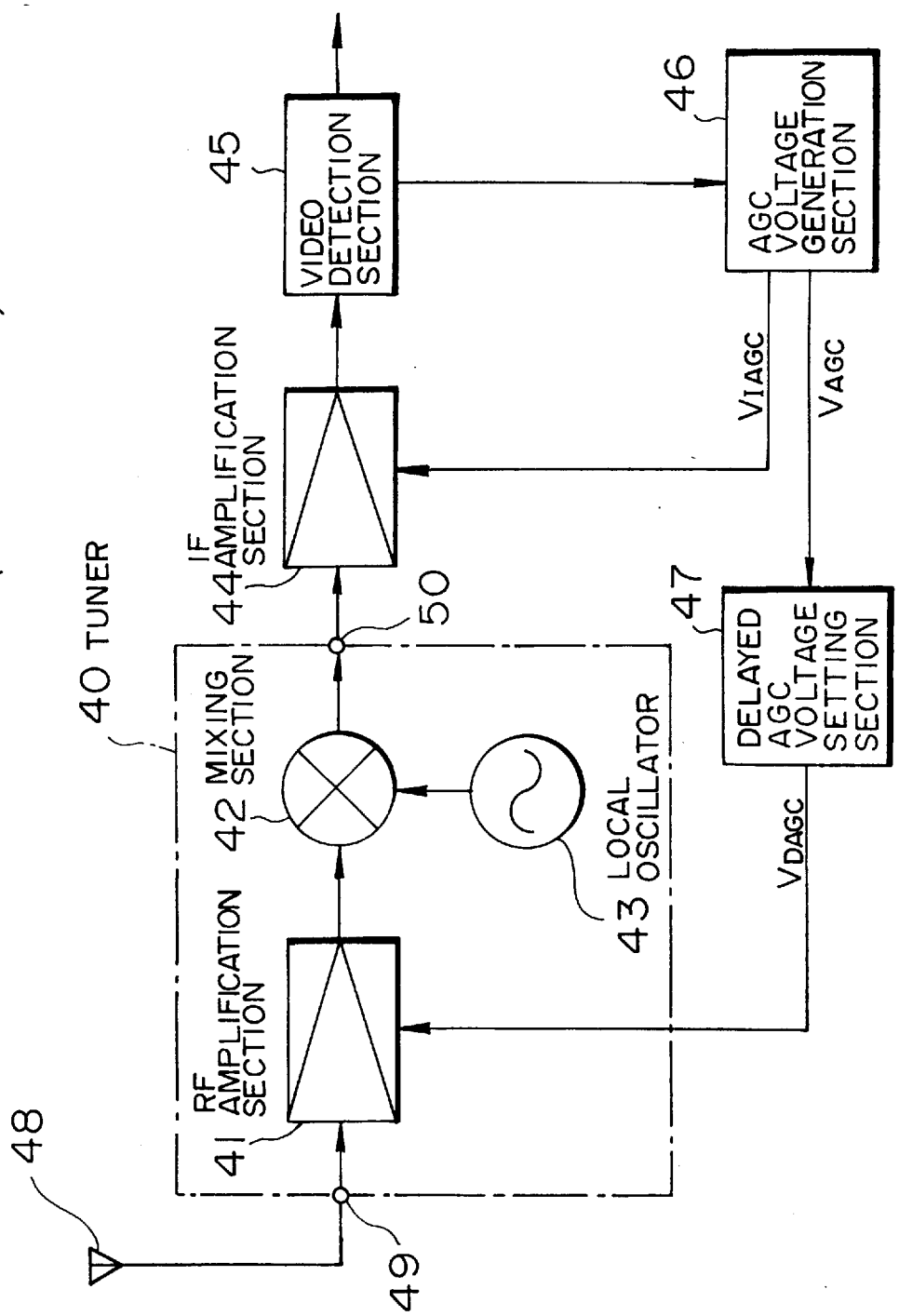
FIG. 4 is a block diagram of an example of the configuration of a known delayed AGC circuit.
Figure 5:
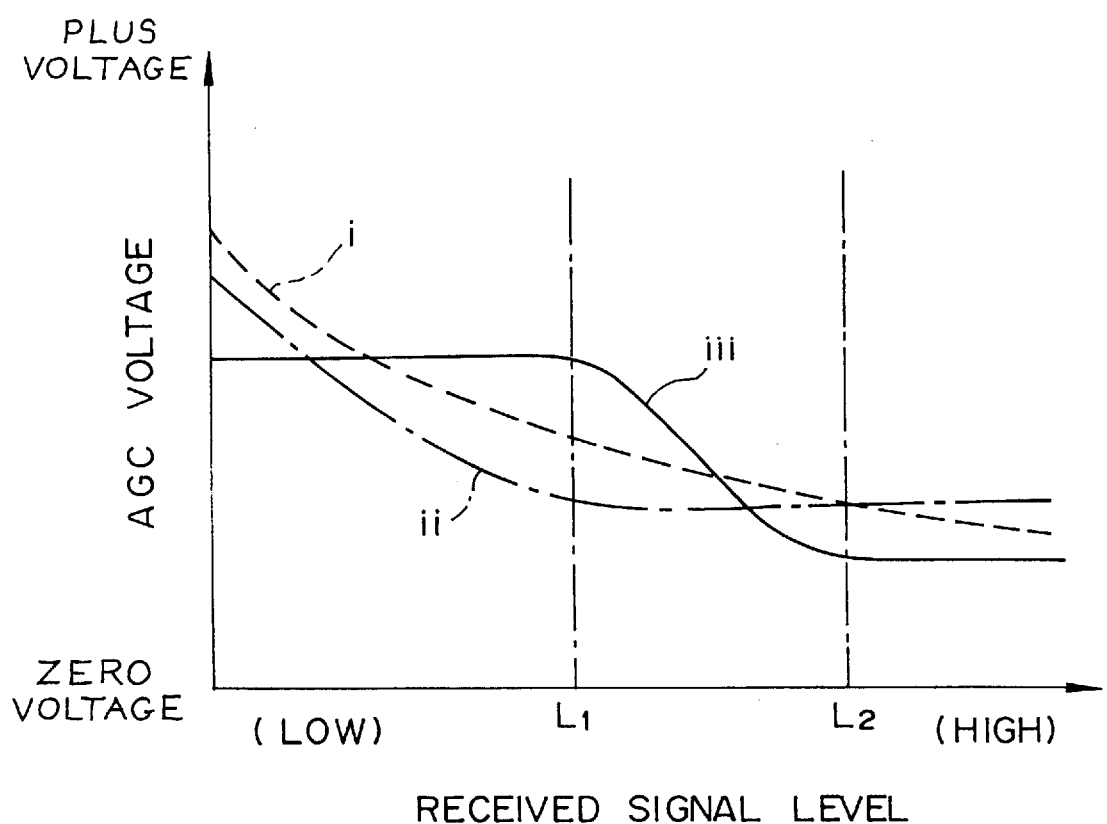
FIG. 5 is a diagram showing examples of the relationship between the received signal level and the AGC voltage and the relationship between the received signal level and the video detection output in the delayed AGC circuit shown in FIG. 4.
Figure 6:
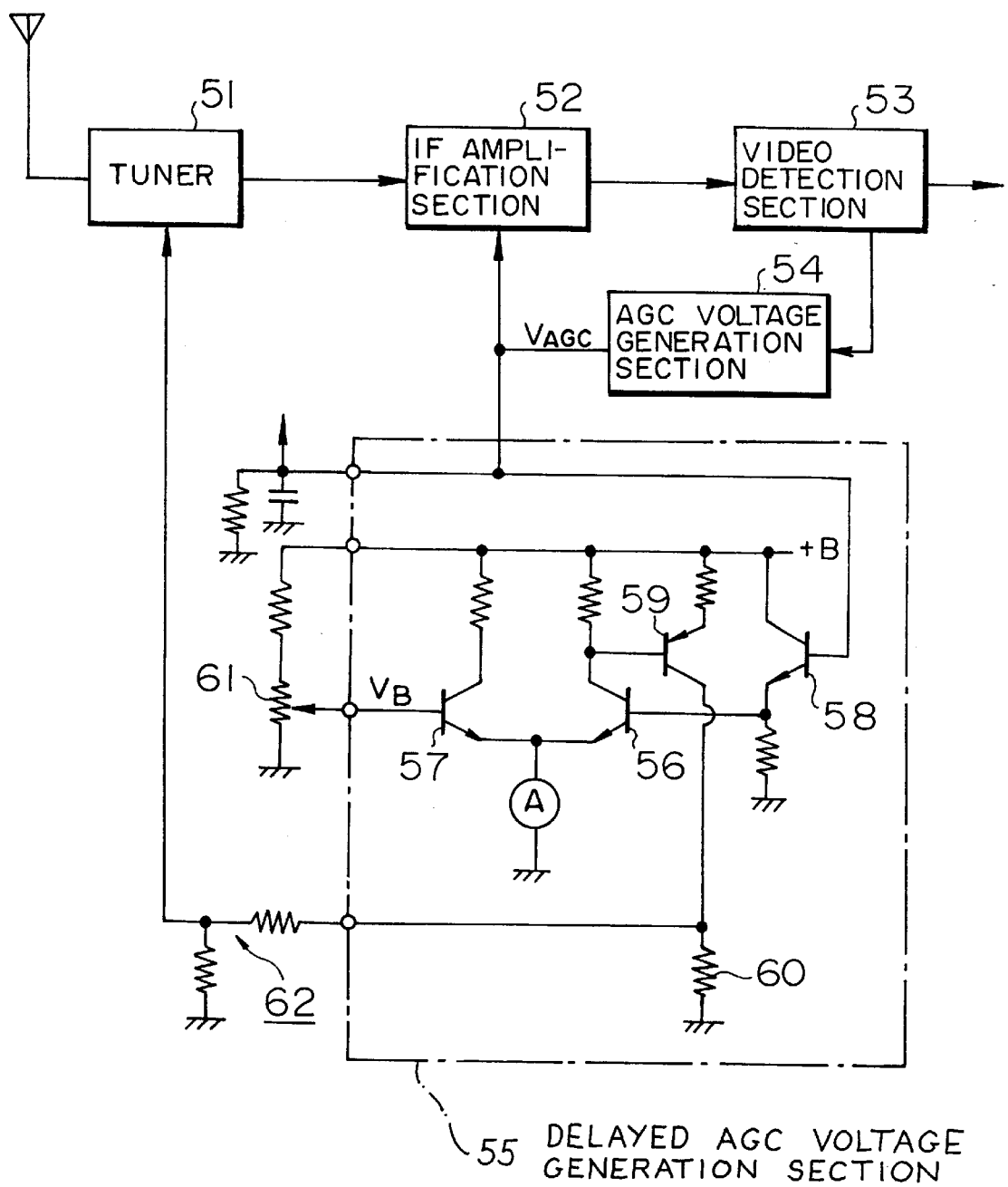
FIG. 6 is a schematic circuit diagram of a known delayed AGC circuit.

FIG. 3 is a characteristic diagram showing an example of the relationship between the received signal level and the AGC voltages in the delayed AGC circuit shown in FIG. 2.

In FIG. 3, the ordinate represents the AGC voltage while the abscissa represents the received signal level. A curve i shown in FIG. 3 indicates AGC voltage $V_{AGC}$, a curve ii AGC voltage $V_{IAGC}$, and a curve iii delayed AGC voltage $V_{DAGC}$.

The operation of the delayed AGC circuit shown in FIG. 2 will be described with reference to the characteristic diagram of FIG. 3.

The amplified received signal supplied to the tuner input terminal 10 is amplified by the first transistor 12 of the RF amplification section 2, and the amplified received signal is frequency-mixed in the mixing section 3 with the oscillated signal from the local oscillator 4 to form a frequency-mixed signal which is supplied to the IF amplification section 5 through the tuner output terminal 11. Only a signal in the frequency-mixed signal having a frequency coinciding with the intermediate frequency of the IF amplification section 5 is selected and extracted by the SAW filter 13, and the extracted IF signal is amplified by the second transistor 14 and thereafter supplied to the video detection section 6. The video detection section 6 performs video detection of the input IF signal and supplies the video detection output to the AGC voltage generation section 7. The AGC voltage generation section 7 generates AGC voltage $V_{AGC}$ according to the video detection output from the video detection section 6, and supplies AGC voltage $V_{AGC}$ to the AGC voltage input terminal 25 of the AGC voltage setting section 8. In the AGC voltage setting section 8, the AGC voltage input terminal 25 and the bias resistor 21 are connected to generate a voltage $V_A$ at the coupling point A. The voltage $V_A$ at the coupling point A is applied to the AGC voltage output terminal 26 through the second diode 20 when the second diode 20 is on, thereby generating AGC voltage $V_{IAGC}=V_A-V_{BE20}$ ($V_{BE20}$: a voltage drop across the second diode 20, ordinarily, about 0.7 V). This AGC voltage $V_{IAGC}$ is applied to the base of the second transistor 14 of the IF amplification section 5 through the AGC voltage supply terminal 24 to control the gain of IF amplification section 5. When the first diode 19 is off, the voltage $V_A$ at the coupling point A is not applied to the resistor voltage divider 18 while a voltage $V_2$ at the second voltage dividing point 18-2 of the resistor voltage divider 18 is applied as delayed AGC voltage $V_{DAGC}$ to the delayed AGC voltage output terminal 27. When the first diode 19 is on, the voltage $V_A$ at the coupling point A is applied to the resistor voltage divider 18, so that a voltage dependent on the AGC voltage $V_{AGC}$ is applied as delayed AGC voltage $V_{DAGC}$ to the delayed AGC voltage output terminal 27. This delayed AGC voltage $V_{DAGC}$ is applied to the base of the first transistor 12 of the RF amplification section 2 to control the gain of the first transistor 12.

As shown in FIG. 3, when the received signal level is low and not higher than level $L_1$, the video detection section 6 produces a video detection output at a comparatively low level corresponding to the received signal level, and the AGC voltage generation section 7 generates AGC voltage $V_{AGC}$ which is decreasing from the maximum value while the received signal level is increasing. In the AGC voltage setting section 8, voltage $V_A$ is generated at the coupling point A by this AGC voltage $V_{AGC}$ applied to the AGC voltage input terminal 25 and by the bias resistor 21 connected to the coupling point A. In this case, because the AGC voltage $V_{AGC}$ is in a comparatively high voltage range, the second diode 20 is maintained in the on state by the application of voltage $V_A$, thereby generating at the AGC voltage output terminal 26 the AGC voltage $V_{IAGC}$ dependent on AGC voltage $V_{AGC}$. This AGC voltage $V_{IAGC}$ is applied to the base of the transistor 14 of the IF amplification section 5 through the AGC voltage input terminal 24. The gain of the transistor 14 is changed according to this AGC voltage $V_{IAGC}$, thus executing AGC. On the other hand, if the voltage at the first voltage dividing point 18-1 of the resistor voltage divider 18 is $V_1$, $V_1 < V_A + V_{BE19}$ (about 0.7 V) is established as the relationship between the voltage $V_1$ and the voltage $V_A$ at the coupling point A when AGC voltage $V_{AGC}$ is in the comparatively high voltage range. The first diode 19 is therefore maintained in the off state. Since in this state AGC voltage $V_{AGC}$ is not applied to the resistor voltage divider 18, the fixed voltage $V_2$ at the second voltage dividing point 18-2 of the resistor voltage divider 18 is applied as delayed AGC voltage $V_{DAGC}$ to the delayed AGC voltage output terminal 27. This delayed AGC voltage $V_{DAGC}$ is applied to the base of the transistor 12 of the RF amplification section 2 through the delayed AGC voltage input terminal 22 to set the gain of the transistor 12 to the maximum value. Consequently, when the received signal level is in the first range, AGC according to the received signal level (reverse AGC) is executed in the IF amplification section 5 but delayed AGC is not executed in the RF amplification section 2 and the maximum gain of the RF amplification section 2 is maintained.

Next, when the received signal level increases in the second range between level $L_1$ and level $L_2$, the video detection output increases with the received signal level, and AGC voltage $V_{AGC}$ decreases continuously from its state corresponding to the first range of the received signal level as the received signal level increases. The AGC voltage setting section 8 generates voltage $V_A$ at the coupling point A by receiving AGC voltage $V_{AGC}$. At this time, AGC voltage $V_{AGC}$ decreases into a comparatively low voltage range such that the relationship between voltage $V_A$ at the coupling point A and AGC voltage $V_{IAGC}$ generated at the AGC voltage output terminal 26 becomes $V_A - V_{IAGC} < 0.7$ V and the voltage drop $V_{BE20}$ across the second diode 20 is $V_{BE20} <$ about 0.7 V, thereby turning off the second diode 20. Therefore, AGC voltage $V_{IAGC}$ is not output through the AGC voltage output terminal 26 and only the base bias voltage is applied to the base of the transistor 14 to set the gain of the transistor 14 to a small fixed value, that is, AGC becomes irresponsive to the change in the received signal. On the other hand, the relationship between voltage $V_1$ at the first voltage dividing point 18-1 of the resistor voltage divider 18 and voltage $V_A$ at the coupling point A becomes $V_1 - V_A >$ about 0.7 V as AGC voltage $V_{AGC}$ decreases into the comparatively low voltage range, thereby turning on the first diode 19. AGC voltage $V_{AGC}$ is then applied to the resistor voltage divider 18, and voltage $V_2$ at the second voltage dividing point 18-2 of the resistor voltage divider 18, which is dependent on AGC voltage $V_{AGC}$, is applied as delayed AGC voltage $V_{DAGC}$ to the delayed AGC voltage output terminal 27. This delayed AGC voltage $V_{DAGC}$ is applied to the base of the transistor 12 of the RF amplification section 2 through the delayed AGC voltage input terminal 22 to change the gain of the transistor 12 according to delayed AGC voltage $V_{DAGC}$, thereby executing delayed AGC (delayed reverse AGC). Consequently, when the received signal level is in the second range, AGC in the IF amplification section 5 becomes irresponsive to the change in the received signal level to maintain the minimum gain of the IF amplification section 5 while delayed AGC according to the received signal level is executed in the RF amplification section 2.

When the received signal level increases further in the third range above level $L_2$, the video detection output also increases with the received signal level and AGC voltage $V_{AGC}$ decreases continuously from its state corresponding to the second range of the received signal level as the received signal level increases. By receiving AGC voltage $V_{AGC}$, the AGC voltage setting section 8 generates voltage $V_A$ at the coupling point A. At this time, since the voltage $(V_{AGC} + V_B)$ is in a low voltage range, the second diode 20 is maintained in the off state. Also in this case, therefore, AGC voltage $V_{IAGC}$ is not output through the AGC voltage output terminal 26, only the base bias voltage is applied to the base of the transistor 14 to maintain the small fixed gain of the transistor 14, and AGC is irresponsive to the change in the received signal. On the other hand, since AGC voltage $V_{AGC}$ decreases into the comparatively low voltage range, the relationship between voltage $V_1$ at the first voltage dividing point 18-1 of the resistor voltage divider 18 and voltage $V_A$ at the coupling point A is still $V_1 - V_A >$ about 0.7 V, so that the first diode 19 is maintained in the on state. At this time, in the voltage applied to the resistor voltage divider 1, bias voltage $V_B$ becomes prevailing because of the decrease in AGC voltage $V_{AGC}$, and voltage $V_2$ at the second voltage dividing point 18-2 of the resistor voltage divider 18, reduced by a certain value by bias voltage $V_B$, is applied as delayed AGC voltage $V_{DAGC}$ to the delayed AGC voltage output terminal 27. This delayed AGC voltage $V_{DAGC}$ is applied to the base of the transistor 12 of the RF amplification section 2 to set the gain of the transistor 12 to a small generally-constant value, and delayed AGC (delayed reverse AGC) becomes irresponsive to the change in the received signal level. Thus, when the received signal level is in the third range, the RF amplification section 2 and the IF amplification section 5 have the minimum gains and AGC responsive to the change in the received signal level is not executed in both the RF amplification section 2 and the IF amplification section 5.

In this embodiment, the received signal level $L_1$ at which delayed AGC in the RF amplification section 2 is started and at which AGC in the IF amplification section 5 becomes irresponsive to the received signal level, and the received signal level $L_2$ at which delayed AGC in the RF amplification section 2 becomes irresponsive to the received signal level can be selected and set as desired by adjusting the resistances of the three resistors 15, 16, and 17 forming the resistor voltage divider 18 and the resistance of the bias resistor 21 in the AGC voltage setting section 8 to suitable values.

In the above-described embodiment of the present invention, the AGC voltage setting section 8 having a simple configuration is used to enable a start point of AGC in the RF amplification section 2, which may vary due to a variation in the gain of the RF amplification section 2 or the IF amplification section 5, a variation in AGC characteristic, or the like, to be fixed at a predetermined received signal level.

According to the present invention, as described above in detail, the AGC voltage setting section 8 for generating delayed AGC voltage $V_{DAGC}$ can be simply formed only of resistor voltage divider 18, diodes 19 and 20 and bias resistor 21. Also, if the resistance values of the resistor voltage divider 18 and the bias resistor 21 are previously selected, the start point of AGC in the RF amplification section 2, which may vary due to a variation in the gain of the RF amplification section 2 or the IF amplification section 5, a variation in AGC characteristic, or the like, can be fixed at a predetermined received signal level without performing a special adjusting operation.

What is claimed is:

1. A delayed automatic gain control circuit comprising:

a tuner including a radio frequency amplification section;

an automatic gain control voltage generation section for generating an automatic gain control voltage dependent on an output signal from said tuner; and an automatic gain control voltage setting section for converting said automatic gain control voltage into a delayed automatic gain control voltage which is supplied to the radio frequency amplification section of said tuner, wherein said automatic gain control voltage setting section is formed by a resistor voltage divider for dividing a power supply voltage and a diode connected to one voltage dividing point of said resistor voltage divider to selectively supply said automatic gain control voltage to said one voltage dividing point according to the level of said automatic gain control voltage, said delayed automatic gain control voltage being output from another voltage dividing point of said resistor voltage divider, wherein an intermediate frequency circuit including an intermediate frequency amplification section is arranged on the output side of said tuner, and said automatic gain control voltage setting section supplies said supplied automatic gain control voltage to said intermediate frequency amplification section to perform automatic gain control, and wherein said automatic gain control voltage setting section outputs said automatic gain control voltage supplied to said diode to said intermediate frequency amplification section through a second diode.

2. A delayed automatic gain control circuit comprising:

a tuner including a radio frequency amplification section, an automatic gain control voltage generation section for generating an automatic gain control voltage dependent on an output signal from said tuner; and an automatic gain control voltage setting section for converting said automatic gain control voltage into a delayed automatic gain control voltage which is supplied to the radio frequency amplification section of said tuner, wherein said automatic gain control voltage setting section is formed by a resistor voltage divider for dividing a power supply voltage and a diode connected to one voltage dividing point of said resistor voltage divider to selectively supply said automatic gain control voltage to said one voltage dividing point according to the level of said automatic gain control voltage, said delayed automatic gain control voltage being output from another voltage dividing point of said resistor voltage divider, wherein an intermediate frequency circuit including an intermediate frequency amplification section is arranged on the output side of said tuner, and said automatic gain control voltage setting section supplies said supplied automatic gain control voltage to said intermediate frequency amplification section to perform automatic gain control, wherein said automatic gain control voltage setting section outputs said automatic gain control voltage supplied to said diode to said intermediate frequency amplification section through a second diode, and wherein said automatic gain control voltage setting section has said automatic gain control voltage supplied to a point of connection between said diode and said second diode and has the power supply voltage simultaneously applied through a resistor.

* * * * *

UNITED STATES PATENT AND TRADEMARK OFFICE
CERTIFICATE OF CORRECTION

PATENT NO.   : 5,884,153
DATED        : March 16, 1999
INVENTOR(S)  : Minobu Okada It is certified that error appears in the above-identified patent and that said Letters Patent is hereby corrected as shown below:

<u>On the Title Page</u>

In column 1, line 1, under "Foreign Application Priority Data", replace "Dec. 20, 1995" with --Dec. 22, 1995--.

Signed and Sealed this

Twenty-seventh Day of July, 1999

Attest:

Q. TODD DICKINSON

*Attesting Officer*    *Acting Commissioner of Patents and Trademarks*